United States Patent
Johnson

(10) Patent No.: US 10,158,362 B2
(45) Date of Patent: *Dec. 18, 2018

(54) APPARATUS FOR PROVIDING SHARED REFERENCE DEVICE WHEREIN AN INTERNAL DEVICE IS CALIBRATED USING REFERENCE DEVICE VIA CALIBRATED CIRCUIT

(71) Applicant: Intel Corporation, Santa Clara, CA (US)

(72) Inventor: Luke A. Johnson, Queen Creek, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/702,620

(22) Filed: Sep. 12, 2017

(65) Prior Publication Data

US 2018/0006652 A1  Jan. 4, 2018

Related U.S. Application Data

(63) Continuation of application No. 14/292,782, filed on May 30, 2014, now Pat. No. 9,768,780.

(51) Int. Cl.
*H03K 19/0185* (2006.01)
*H04L 25/02* (2006.01)
*G06F 13/37* (2006.01)

(52) U.S. Cl.
CPC ..... *H03K 19/018585* (2013.01); *G06F 13/37* (2013.01); *H04L 25/0274* (2013.01)

(58) Field of Classification Search
CPC ............ H03K 19/018585; G06F 13/37; H04L 25/0274
See application file for complete search history.

(56) References Cited

U.S. PATENT DOCUMENTS

| 5,134,311 A * | 7/1992 | Biber ................. H03K 19/0005 326/30 |
| 6,677,744 B1 * | 1/2004 | Long .................. G01R 31/2853 324/762.02 |
| 7,057,397 B1 * | 6/2006 | Davidson ......... G01R 31/31715 324/606 |
| 9,768,780 B2 * | 9/2017 | Johnson ......... H03K 19/018585 |
| 2005/0071693 A1 * | 3/2005 | Chun .................... G06F 1/3203 713/300 |

* cited by examiner

*Primary Examiner* — Tammara R Peyton
(74) *Attorney, Agent, or Firm* — Womble Bond Dickinson (US) LLP

(57) ABSTRACT

Described is an apparatus which comprises: a reference device; and a processor having a plurality of circuit units, each circuit unit is operable to electronically couple with the reference device such that only one circuit unit of the plurality of circuit units is electronically coupled to the reference device at a given time while other circuit units of the plurality are electronically uncoupled to the reference device during that time.

18 Claims, 8 Drawing Sheets

APPARATUS FOR PROVIDING SHARED REFERENCE DEVICE WHEREIN AN INTERNAL DEVICE IS CALIBRATED USING REFERENCE DEVICE VIA CALIBRATED CIRCUIT

RELATED APPLICATIONS

This application is a continuation of U.S. NON-PROVISIONAL application Ser. No. 14/292,782, filed on May 30, 2014, the entire contents of which are hereby incorporated by reference.

BACKGROUND

Processors may have several calibrating devices that need calibration using external devices. For example, for each type of input-output (IO) transmitter having an on-die termination, a replica circuit with its own external resistor is used to calibrate the on-die termination in the replica circuit according to the external resistor. This calibrated on-die termination is then used to set the on-die termination for the IO transmitters. If there are ten different types of IO transmitters, then ten different external resistors are used for calibrating the on-die resistances of the ten different replica IO transmitters. For each external resistor, a separate pin is required. In some cases more than one pin is used per external reference device. These additional pins increase cost of the processor and also add complexity to routing in motherboards.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
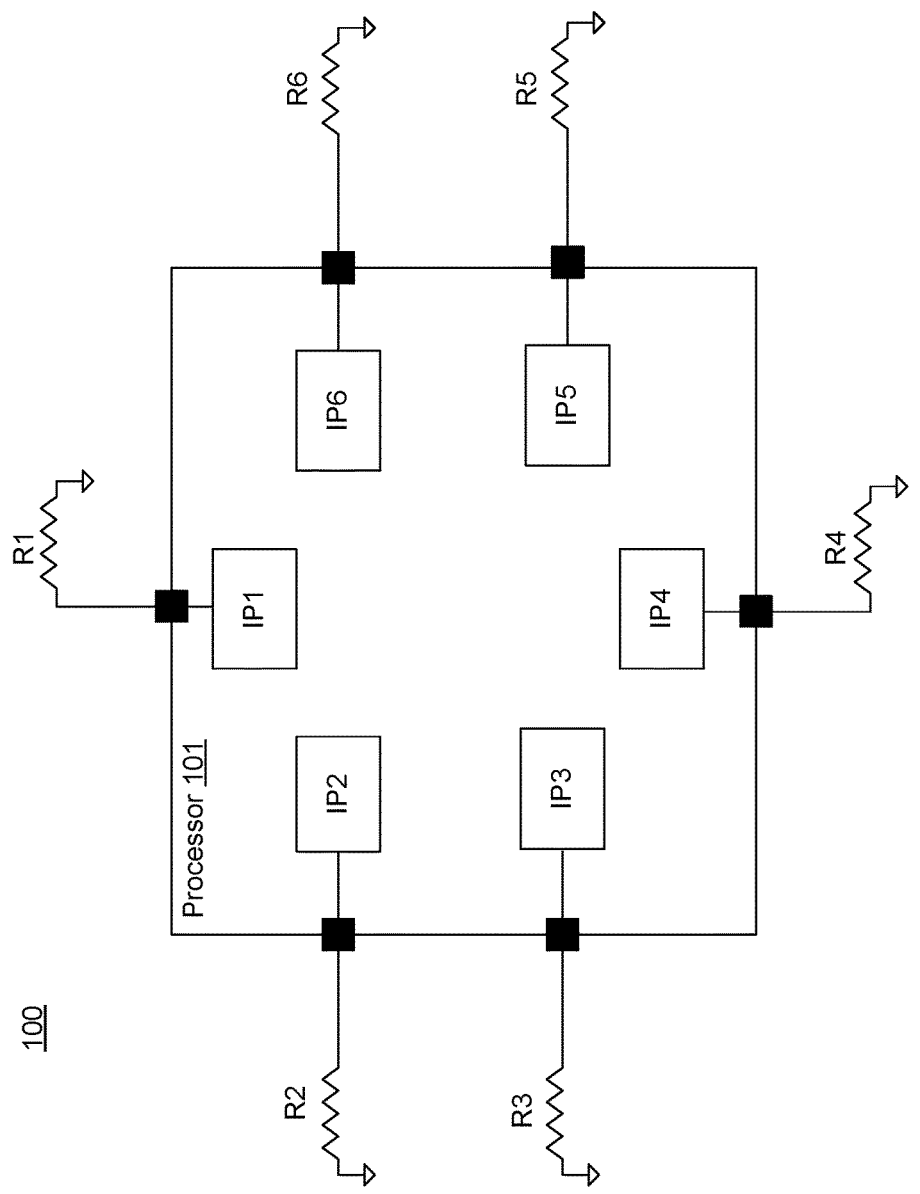
FIG. 1 illustrates system having a processor with multiple external resistors for calibrating multiple internal resistors.

Some embodiments describe a mechanism which enables all Intellectual Property (IP) blocks in a processor to share a single external reference device (which is external to the processor) to calibrate the calibration devices in the IP blocks. One example of an IP block is a replica input-output (I/O) transmitter having an on-die termination which is calibrated by an external reference resistor. In this example, the replica on-die termination is used as the calibration device and the external reference resistor is the external reference device.

There are several constrains on global resistance compensation (R-Comp) solutions. For example, the solution should enable compensation of different calibration devices for different IP blocks, the solution should account for within die variation, the solution should track time varying effects (e.g., variations in voltage and temperature), and the solution should provide accurate calibration results. Some embodiments provide the above solutions using a single external reference device for calibrating one or more types of calibration devices in the one or more IP blocks.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nano tubes or spintronic devices. Source and drain terminals may be identical terminals and are interchangeably used here. A transistor can also be a Tunneling FET (TFET) device which has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a system 100 having a processor 101 with multiple external resistors for calibrating multiple internal resistors. Here, processor 101 includes multiple external resistors R1-R6 for providing reference resistances for IP blocks IP1-IP6, respectively. Each IP block may be different than the other IP block and provides a calibrated code or value for a specific calibration device that is calibrated using a corresponding external reference resistor. For example, IP1 block is a first type of I/O, and external resistor R1 may provide the reference resistance for calibrating an on-die resistor in IP1 block for the first type of I/O. For each external resistor, a pin of processor 101 is used. Reducing the number of pins in a processor reduces the overall cost of the processor.

Figure 2A:
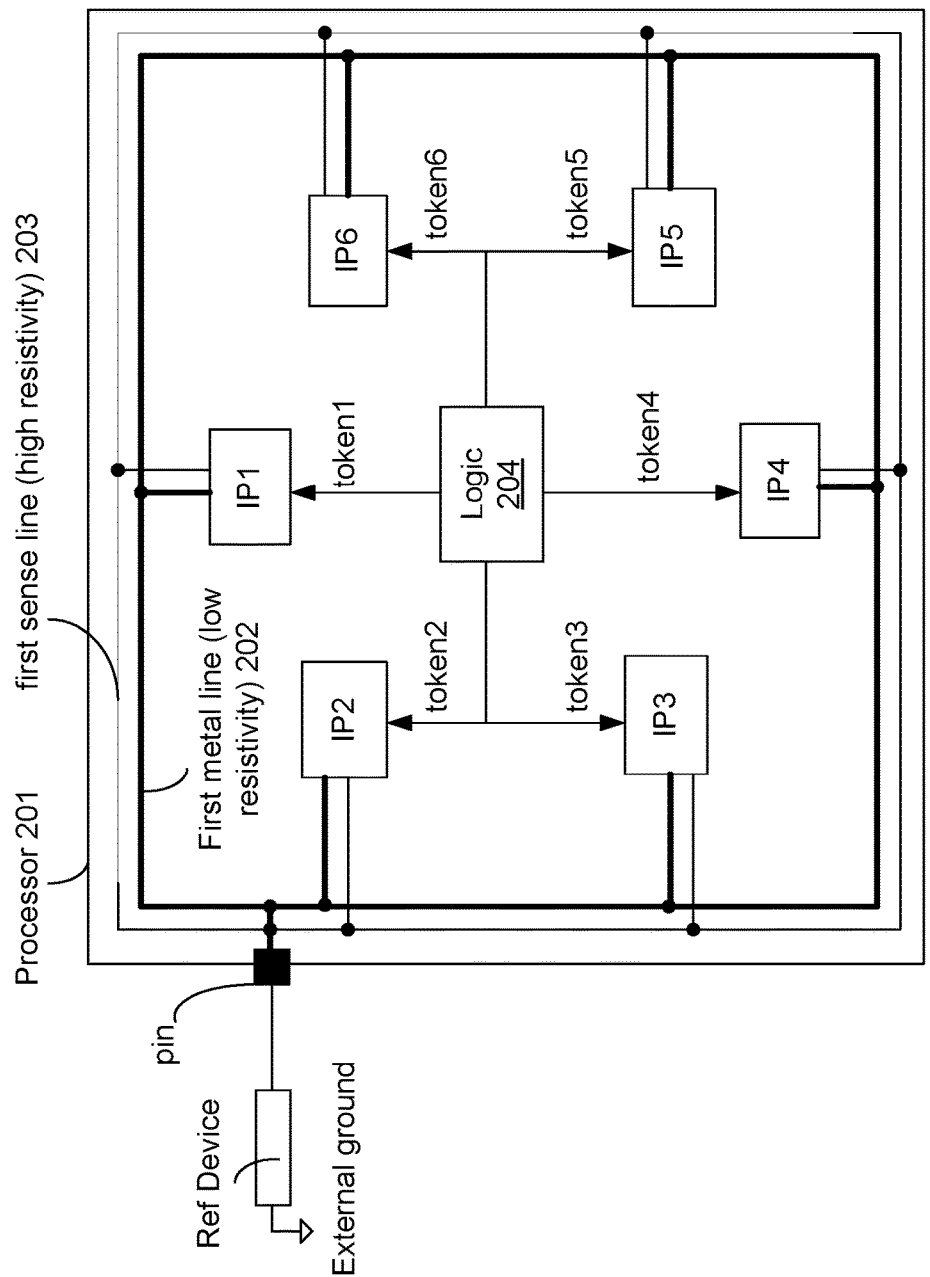
FIG. 2A illustrates system having a processor with a reference device for calibrating multiple intellectual property (IP) blocks, according to one embodiment.

FIG. 2A illustrates a system 200 having processor 201 with a reference device for calibrating multiple IP blocks in processor 201, according to one embodiment of the disclosure. In one embodiment, system 200 comprises a single reference (Ref) Device coupled to processor 201 via a pin, and Logic 204. In this embodiment, one terminal of the Ref Device is coupled to the pin while the other terminal of the Ref Device is coupled to an external ground. In one embodiment, processor 201 includes a first metal line 202 which is formed form a metal layer of low resistivity compared to other metal layers in processor 201.

For example, in a processor with seven metal layers (i.e., M1-M7), the highest metal layer (i.e., M7) having the lowest resistivity while the lowest metal layer (i.e., M1) in the hierarchy having the highest resistivity, first metal line 202 is formed using M7. Here, first metal line 202 is shown as a bold solid line indicating a higher metal layer with lower resistivity. In one embodiment, the first terminal of the Ref Device (which is coupled to the pin) is coupled to first metal line 202. In one embodiment, first metal line 202 is routed along the perimeter of processor 201. In another embodiment, first metal line 202 is routed through the die. In one embodiment, each IP block (i.e., blocks IP1-IP6) is also operable of being electrically coupled to first metal line 202 to electronically couple that IP block to the first terminal of the Ref Device. While the embodiments are described with reference to six IP blocks, any number and any type of IP blocks may be used with the embodiments.

In one embodiment, a first sense line 203 is coupled to the first terminal of the Ref Device and routed along first metal line 202. For example, first sense line 203 is routed along the perimeter of processor 201 and is in close proximity to first metal line 202 (albeit different metal layers). In this embodiment, first sense line 203 may be formed from a metal layer of higher resistivity (e.g., M1) because this metal line behaves as a sense line and is configured to carry a voltage potential and not to provide current. Here, first sense line 203 is illustrated by a thin solid line indicating lower metal layer with higher resistivity compared to the resistivity and metal layer location for first metal line 202. In one embodiment, each IP block is also coupled to first sense line 203.

In one embodiment, Logic 204 provides tokens to the IP blocks to cause one of the IP block to electrically couple (e.g., via a multiplexer or pass-gate) with first metal line 202 and first sense line 203. For example, Logic 204 provides tokens token1-token6 to IP blocks IP1-IP6, respectively, such that only one token is valid causing one IP block to electrically couple to first metal line 202 and first sense line 203. In such an embodiment, other IP blocks that receive invalid tokens are not electrically coupled to first metal line 202 and first sense line 203. In one embodiment, after the calibration device in the IP block, which is electrically coupled to first metal line 202 and first sense line 203, is calibrated using the Ref Device, then the valid token for that IP block is made invalid and another token for another IP block is made valid. In one embodiment, Logic 204 causes each IP block to electrically couple to the Ref Device in a round robin fashion.

For example, Logic 204 causes IP block IP1 to electrically couple with first metal line 202 and first sense line 203 while keeping other IP blocks uncoupled from the Ref Device, and then after a predetermined time or, in an alternative embodiment, after the IP block indicates it has completed calibration, Logic 204 decouples IP block IP1 from the Ref Device and couples IP block IP2 with Ref Device while keeping other IP blocks uncoupled from the Ref Device. In other embodiments, Logic 204 implements other types of IP management solutions to couple one IP block at a time with Ref Device. For example, to deal with time varying effects (e.g., effects caused by changing environmental conditions such as temperature, voltage, etc.), Logic 204 may issue tokens for the IP blocks at a programmable rate (e.g., every 10 ms) to allow each IP block to update their calibration code in view of the time varying effects. In another example, tokens are issued after a preset change in temperature is detected. Here, using a single Ref Device to calibrate any number of calibration devices in the IP blocks allows the processor to use a single pin for calibration purposes instead of multiple pins used in FIG. 1.

Figure 2B:
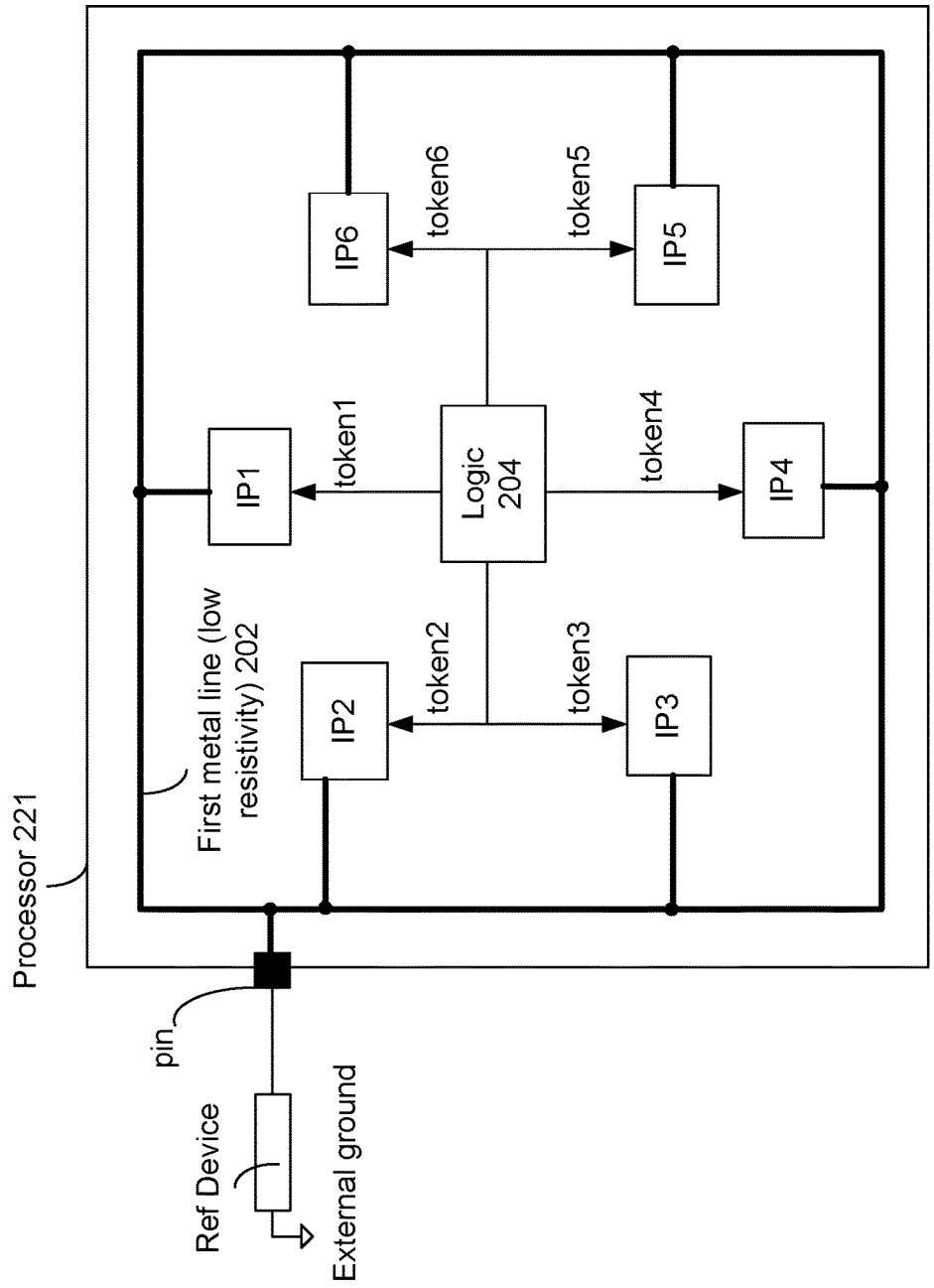
FIG. 2B illustrates a system having processor with a reference device for calibrating multiple IP blocks in processor, according to one embodiment.

FIG. 2B illustrates a system 220 having processor 221 with a reference device for calibrating multiple IP blocks in processor 221, according to one embodiment of the disclosure. It is pointed out that those elements of FIG. 2B having the same reference numbers (or names) as the elements of any other figure can operate or function in any manner similar to that described, but are not limited to such. The embodiment of FIG. 2B is similar to the embodiment of FIG. 2A except that first sense line 203 (of high resistivity) is removed. For example, if a process node has sufficiently low resistivity on a metal layer, an explicit sense line may not be required.

Figure 3A:
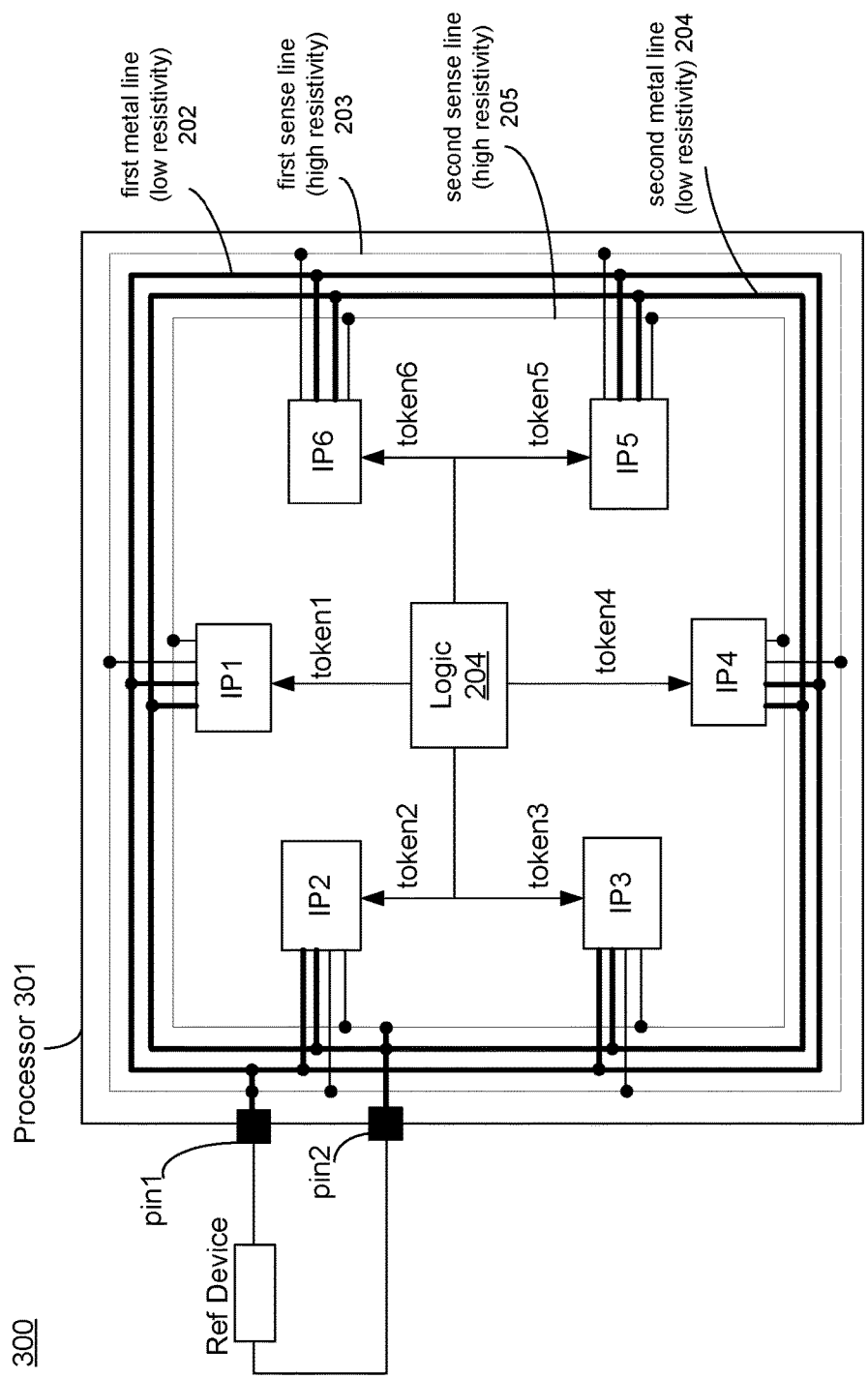
FIG. 3A illustrates a system having processor with a reference device for calibrating multiple IP blocks, according to another embodiment of the disclosure.

FIG. 3A illustrates a system 300 having a processor 301 with a reference device for calibrating multiple IP blocks, according to another embodiment of the disclosure. It is pointed out that those elements of FIG. 3A having the same reference numbers (or names) as the elements of any other figure can operate or function in any manner similar to that described, but are not limited to such.

So as not to obscure the embodiments, differences between FIG. 2A and FIG. 3A are described. In this embodiment, processor 301 of system 300 includes two metal lines of first type (i.e., of low resistivity type) and two metal lines of second type (i.e., of high resistivity type) to couple the Ref Device with the IP blocks. In this embodiment, the first terminal of the Ref Device is coupled to pin1 of processor 301 and the second terminal of the Ref Device is coupled to pin2 of processor 301. This embodiment provides for more flexibility in each IP on the biasing configuration of the reference resistor. Here, the two metal lines of first type (i.e., low resistivity) are illustrated with thick bold lines—first metal line 202 and second metal line 204 while the two metal lines of second type (i.e., high resistivity) are illustrated with thin light lines—first sense line 203 and second sense line 205.

In one embodiment, the two metal lines of the second type are routed in parallel (albeit different layers/hierarchy) to the two metal lines of the first type. One reason for using the two metal lines—first sense line 203 and second sense line 205—to have high resistivity is that it frees up routing area in the higher metal layer (e.g., M7 is used for first metal line 202 and second metal line 204) and that the two metal lines carry substantially zero current. In this embodiment, first metal line 202 and first sense line 203 are coupled to first terminal of Ref Device, where the second metal line 204 and sense line 205 are coupled to the second terminal of the Ref Device. Inside each IP, when permitted as indicated by possession of the token, the terminals are driven in accordance to the individual needs of that particular IP. For a Ref Device which is a reference resistor, some IPs may connect the reference resistor to ground as in prior embodiments while other IPs may connect it to VCC or even calibrate pull-up and pulldown resistors simultaneously in a differential fashion. In this embodiment, ground connection (or VCC) connection is made inside each IP block. For example, instead of using a chip-level ground connection, local ground nodes are provided in each IP block.

Figure 3B:
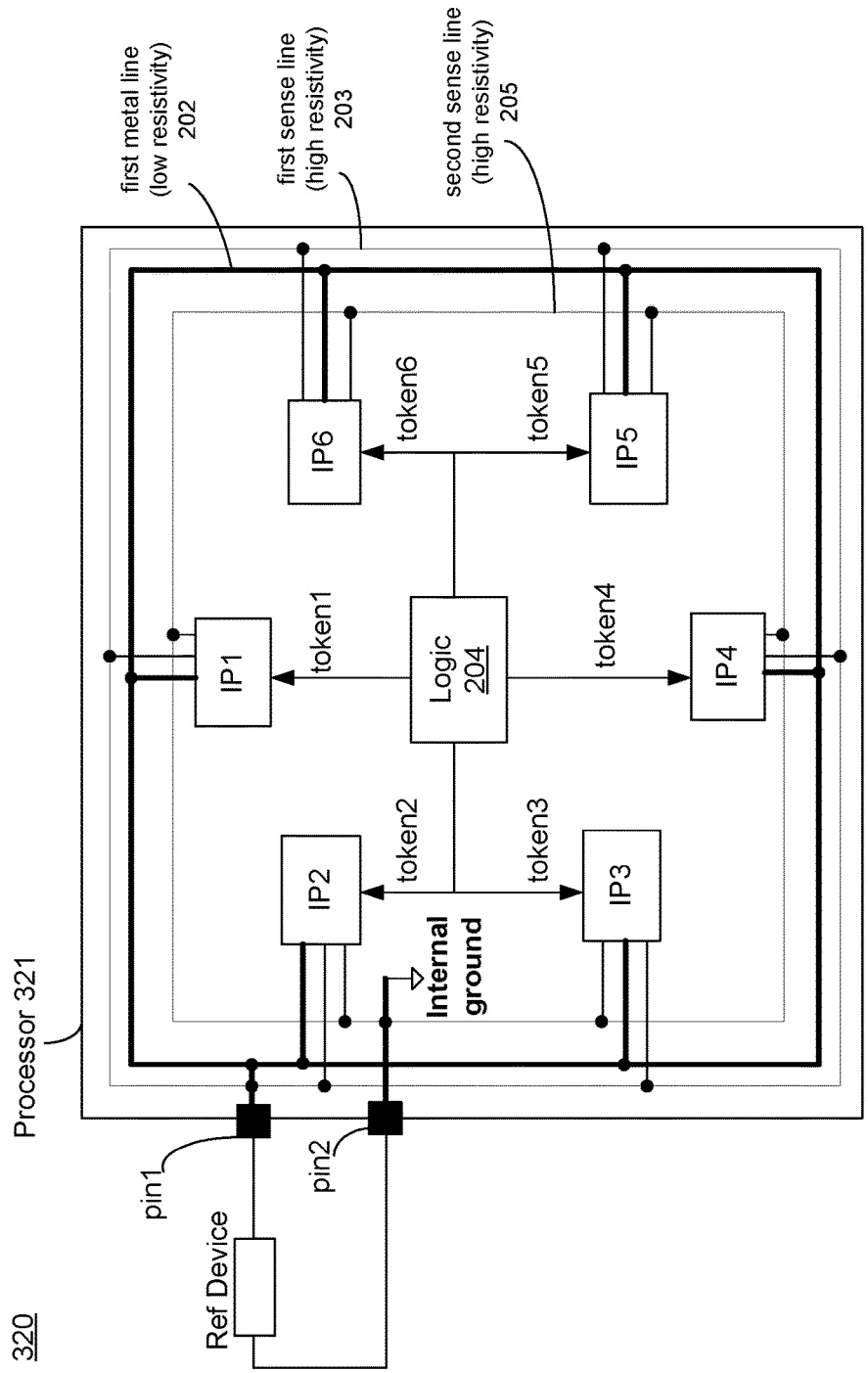
FIG. 3B illustrates a system having a processor with a reference device for calibrating multiple IP blocks, according to another embodiment of the disclosure.

FIG. 3B illustrates a system 320 having a processor 321 with a reference device for calibrating multiple IP blocks, according to another embodiment of the disclosure. It is pointed out that those elements of FIG. 3B having the same reference numbers (or names) as the elements of any other figure can operate or function in any manner similar to that described, but are not limited to such.

So as not to obscure the embodiments, differences between FIG. 3A and FIG. 3B are described. In this embodiment, there is one thick line (i.e., first metal line 202) and two sense lines (i.e., first and second sense lines 203 and 205). In this embodiment, the internal ground does not use another thick line i.e., the internal ground can be sensed using a metal wire of high resistivity.

In one embodiment, multiplexer options are provided to allow IP blocks to change the bias of the reference device to each IP blocks' needs. For example many IPs may still connect the other reference device terminal to ground, but some may connect it to VCC instead so to calibrate a local reference device to ground.

Figure 4:
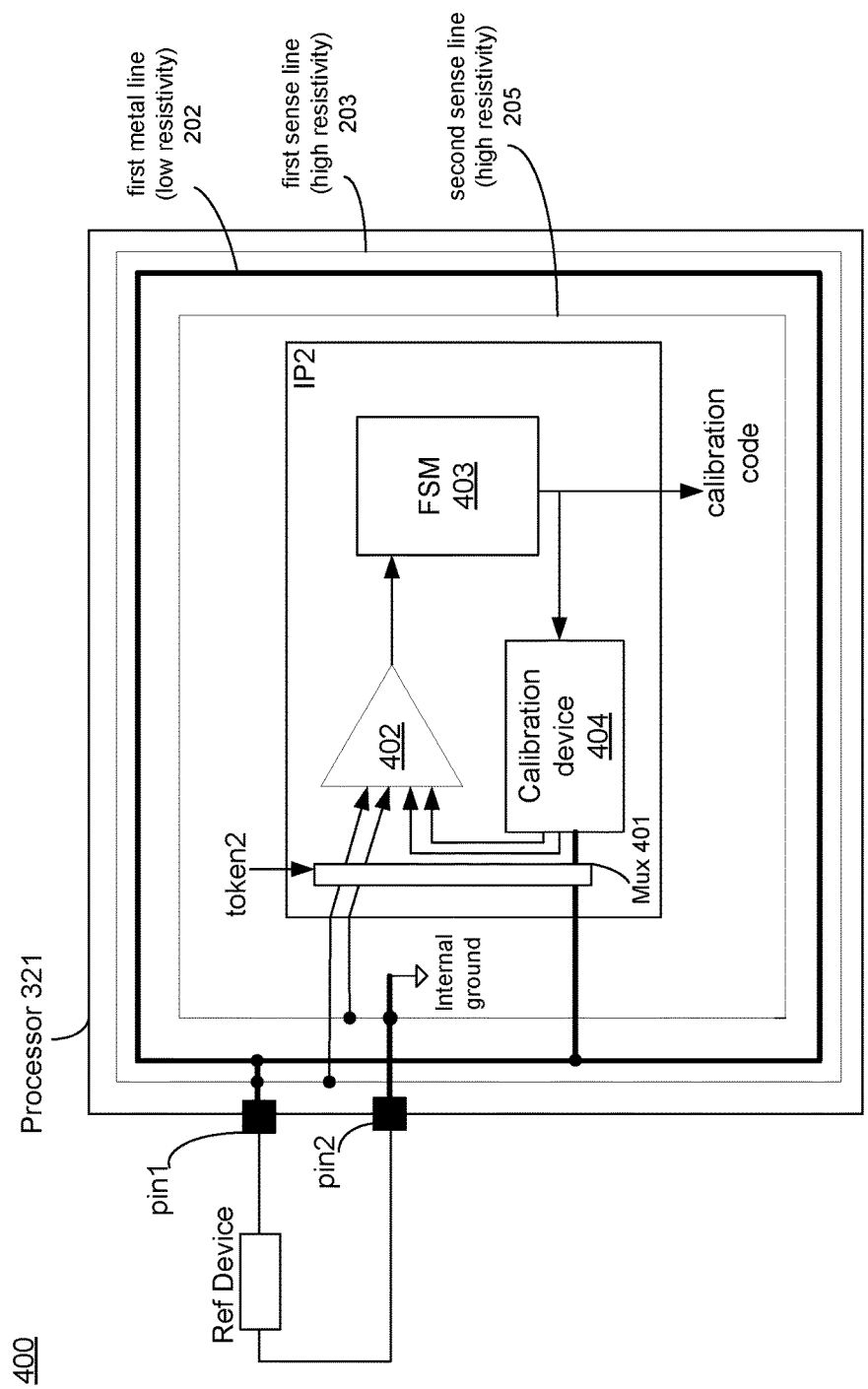
FIG. 4 illustrates a system having a processor with an IP block for calibrating a Calibration device using the Reference device, according to one embodiment of the disclosure.

FIG. 4 illustrates a system 400 having processor 321 with an IP block for calibrating a Calibration device using the Reference device, according to one embodiment of the disclosure. It is pointed out that those elements of FIG. 4 having the same reference numbers (or names) as the elements of any other figure can operate or function in any manner similar to that described, but are not limited to such.

To illustrate a possible architecture of an IP block, IP block IP2 is described. Other IP blocks may have similar or different architectures for calibrating their respective calibration devices. In one embodiment, IP block IP2 comprises a selection circuit 401, comparator 402, finite state machine (FSM) 403, and Calibration device 404. In one embodiment, selection circuit 401 is a multiplexer (Mux) or pass-gates controllable by token2 signal. For example, when token2 is valid (e.g., when it is logical high) then Mux 401 electrically couples the inputs of comparator 402 to first and second sense lines 203 and 205, respectively. Likewise, when token2 is invalid (e.g., when it is logical low) then Mux 401 electrically uncouples the inputs of comparator 402 from first and second sense lines 203 and 205, respectively. Here, the labels for signals and nodes are interchangeably used. For example, token2 is used to described signal token2 or node token2 depending on the context of the sentence.

In one embodiment, comparator 402 is a differential comparator. In one embodiment, comparator 402 is a flash comparator as described with reference to FIG. 5. In other embodiments, comparator 402 can be implemented as any known comparator. Referring back to FIG. 4, in one embodiment, comparator 402 compares the voltage drop across the Calibration device 404 with voltage on first sense line 203 relative to local ground on second sense line 205. In one embodiment, output of comparator 402 indicates whether output of Calibration device 404 is higher or lower than voltage on first sense line 203 relative to local ground on second sense line 205. In response to the output of comparator 404, FSM 403 (e.g., counters) adjusts the calibration code (e.g., it increases it or decreases a count representing the calibration code) to change the electrical characteristics of the Calibration device 404. This process of adjusting the calibration code continues till the output of comparator 402 switches from its previous voltage level indicating that Calibration device 404 is calibrated with reference to the external Ref Device.

When FSM 403 concludes that Calibration device 404 is calibrated, the calibration code is used by other circuits (e.g., I/Os) for calibrating their devices (e.g., on-die termination resistors). In one embodiment, Calibration device 402 is a current source and the external Ref Device is a reference current source. In other embodiments, other types of calibration devices and external Ref devices may be used.

While the embodiment of FIG. 4 is described with reference to processor 321, it is also applicable to other embodiments in which ground terminal is an external ground terminal. In such an embodiment, Mux 401 receives first sense line 203 as input which is provided to comparator 402 when token1 is valid.

Figure 5:
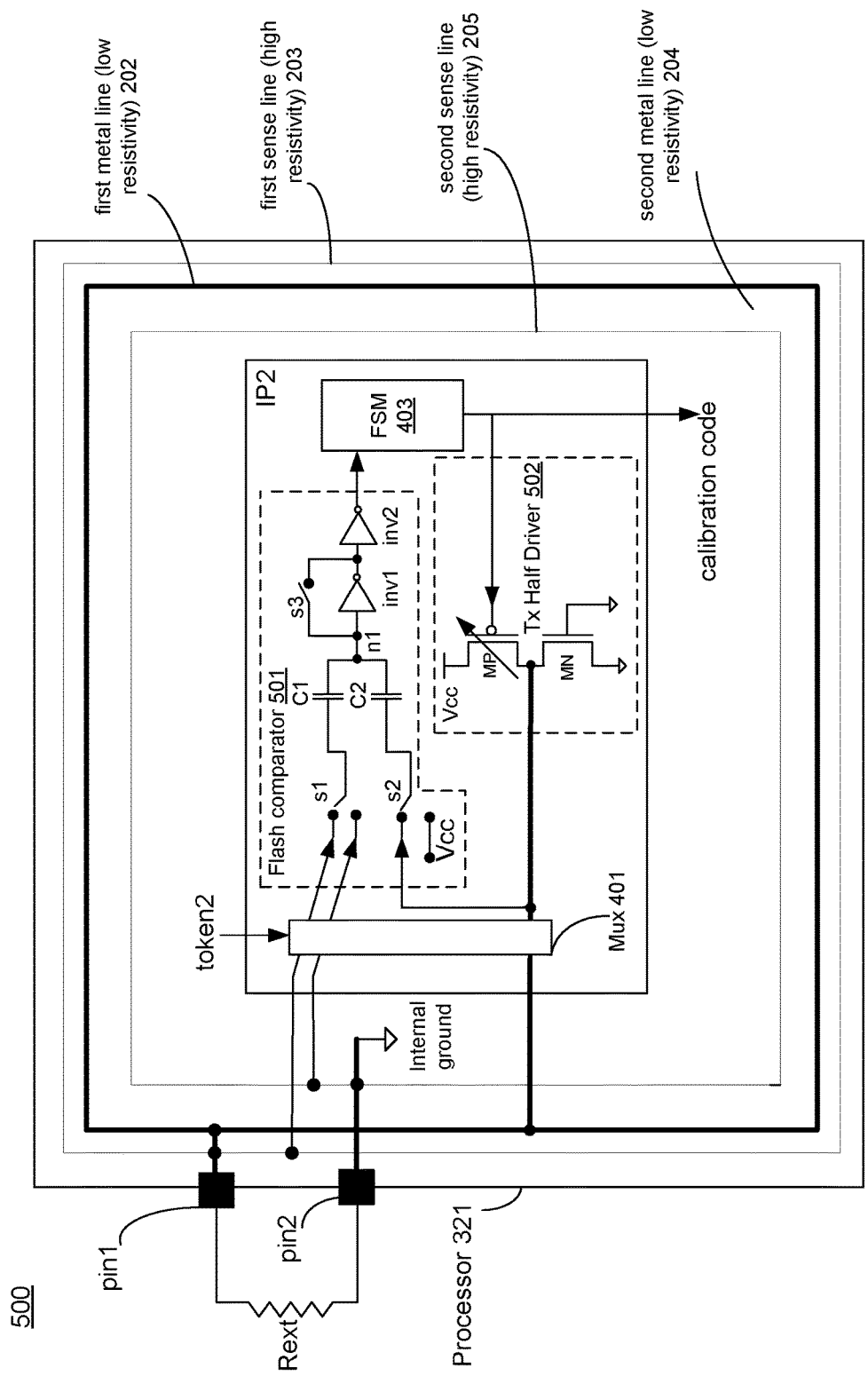
FIG. 5 illustrates a system having a processor with an IP block for calibrating a resistor using a reference resistor, according to one embodiment.

FIG. 5 illustrates a system 500 having processor 321 with an IP block for calibrating a resistor using a reference resistor, according to one embodiment of the disclosure. It is pointed out that those elements of FIG. 5 having the same reference numbers (or names) as the elements of any other figure can operate or function in any manner similar to that described, but are not limited to such. In this embodiment, comparator 401 is a flash comparator 501, and Calibration device 402 is one set of transistors (here MP) of transmitter (Tx) Half Driver 502. In one embodiment, flash comparator 501 comprises switches s1, s2, and s3; capacitors C1 and C2, and inverters inv1 and inv2 coupled together as shown. Here, Ref Device is an external reference resistor (Rext).

In one embodiment, initially, switch s3 closes and electrically shorts the output of inverter inv1 to its input (node n1) so that inverter inv1 is configured to trip at its threshold voltage (also referred here as the tripping voltage point). In one embodiment, while switch s3 is closed, switch s1 charges capacitor C1 to the high side of the reference resistor (coupled via the thick metal line 202 to the calibration resistor in Tx Half Driver 502). In one embodiment, switch s2 charges capacitor C2 to the output of Tx Half Driver 502

(coupled via the thick metal line 202 to the reference resistor). In one embodiment, in the absence of any appreciable resistance in the low resistance line 202, voltages on capacitors C1 and C2 will be the same. In some embodiments, there may be noticeable resistance so the voltages may not be equal and the use of the sense line enables to charge capacitor C1 to the voltage on the end of the first metal line 202 near the reference and capacitor C2 to the voltage on the same metal line 202 near the calibration device.

After switch s3 is opened, in one embodiment, switches s1 and s2 toggle to inject a charge via capacitors C1 and C2 proportional to the difference in the voltage at each terminal of switch s1 times the value of the associated capacitor C1 or C2. In one embodiment, switch s1 couples the low side terminal of the reference resistor (coupled to ground) to capacitor C1 and switch s2 couples capacitor C2 to the high side terminal of the calibration Tx Half Driver 502 resistor (i.e., local VCC). In one embodiment, if the capacitors are equal in value then the two charges injected onto node n1 are equal when the voltage difference across the input terminals of switch s1 is equal to the voltage difference across the input terminals of switch s2.

In such an embodiment, when the voltage across the local Tx Half Driver is equal to the voltage across the external resistor, the voltage at node n1 may not change and comparator 501 may remain at its threshold. In one embodiment, if the voltage across the Tx Half Driver 502 is ever so slightly higher than the voltage across the reference resistor then the voltage at node n1 may rise causing comparator 501 to output a high or true value. In this embodiment, the voltage on node n1 is compared with the threshold voltage (or tripping voltage) of inverter inv1 to determine whether voltage across Tx Half Driver 502 is above or below the voltage across the reference resistor.

In this embodiment, Tx Half Driver 502 includes a plurality of p-type transistors MP coupled together in parallel, and a plurality of n-type transistors MN coupled together in parallel with one another and in series with transistors MP. In one embodiment, transistors MP are binary weighted. In one embodiment, transistors MP are thermometer weighted. In another embodiment, a hybrid combination of partial binary and partial thermometer may be used. Here, MP is being calibrated against Rext. In one embodiment, FSM 403 turns on/off transistors MP to change the output voltage till it is equal to the voltage on first sense line 203. At that point the calibration code is used for setting the resistance of the on-die termination resistors in various I/Os.

In one embodiment, resistance of Rext is the same as the desired on-die termination resistance. In such an embodiment, capacitors C1 and C2 are identical (i.e., they have equal capacitances). In one embodiment, resistance of Rext is three times larger than the desired on-die termination resistance. For example, Rext is 150 Ohms and the desired on-die termination resistance is 50 Ohms. In such an embodiment, capacitor C2 has a capacitance which is three times larger than the capacitance of capacitor C1. This is useful for the shared calibration scheme detailed here since all IPs on the product are forced to use the same external reference device. Each IP can use its own capacitor ratio to reach whatever local value is desired. Capacitors C1 and C2 can be implemented with any known capacitor technology. For example, capacitors C1 and C2 are transistor based capacitors, metal capacitors, or a combination of both.

Figure 6:
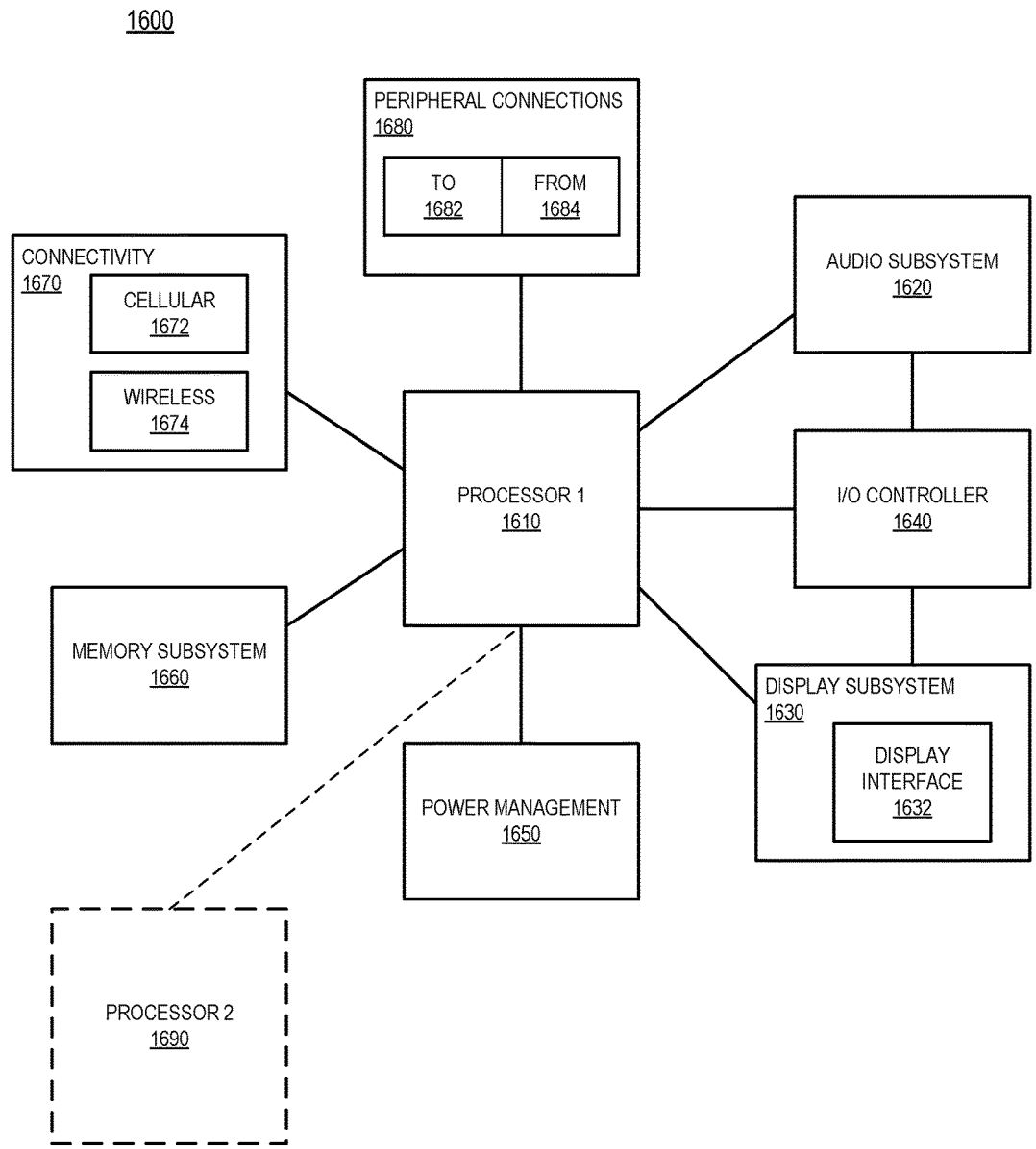
FIG. 6 is a smart device or a computer system or a SoC (System-on-Chip) with a reference device for calibrating multiple IP blocks, according to one embodiment.

FIG. 6 is a smart device or a computer system or a SoC (System-on-Chip) with a reference device for calibrating multiple IP blocks, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 apparatus with a reference device for calibrating multiple IP blocks. Other blocks of the computing device 1600 may also include apparatus with a reference device for calibrating multiple IP blocks. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a reference device; and a processor having a plurality of circuit units, each circuit unit is operable to electronically couple with the reference device such that only one circuit unit of the plurality of circuit units is electronically coupled to the reference device at a given time while other circuit units of the plurality are electronically uncoupled to the reference device during that time. In one embodiment, the reference device is positioned external to the processor. In one embodiment, the reference device is incorporated in a package of the processor.

In one embodiment, the reference device is at least one of: a resistor, current source, or diode. In one embodiment, the processor includes a first metal line to electronically couple one of the circuit units of the plurality of circuit units with a first terminal of the reference device, and wherein the first metal line is formed from a metal layer with lower resistivity compared to other metal layers in the processor. In one embodiment, the processor includes an additional metal line coupled to the first terminal of the reference device, and wherein a second terminal of the reference device is coupled to a power or ground plane. In one embodiment, the additional metal line is formed from a metal layer with higher resistivity compared to resistivity of the first metal line.

In one embodiment, the additional metal line is routed in parallel to the first metal line. In one embodiment, the additional metal line is electronically coupled to each of the circuit units of the plurality of circuit units. In one embodiment, the processor includes a pair of metal lines, and wherein each metal line of the pair of metal lines is coupled to the first terminal and a second terminal of the reference device. In one embodiment, the pair of metal lines is formed from metal layers with higher resistivity compared to resistivity of the first metal line. In one embodiment, the pair of metal lines are routed in parallel to the first metal line. In one embodiment, the pair of metal lines are electronically coupled to each of the circuit units of the plurality of circuit units.

In one embodiment, the processor includes a second metal line to electronically couple one of the circuit units of the plurality of circuit units with a second terminal of the reference device, and wherein the second metal line is formed from the same type of metal layer as the first metal line. In one embodiment, the second terminal of the reference device is coupled to a ground node inside the processor. In one embodiment, the second terminal of the reference device is coupled to a bias node inside the processor. In one embodiment, the second terminal of the reference device is coupled to a ground node external to the processor.

In one embodiment, the processor includes logic to provide a valid token to one of the circuit units of the plurality to cause that circuit unit to electronically couple with the resistive device, while the logic is to provide an invalid token to other circuit units to cause the other circuit units to electronically uncouple with the reference device. In one embodiment, the processor includes logic to cause each of the circuit units to electronically couple with the reference device in a round robin such that at any one time only one circuit unit of the plurality is electronically coupled to the reference device.

In one embodiment, the processor includes an internal calibration device which is calibrated, via a calibration circuit of the electrically coupled circuit unit, using the reference device. In one embodiment, the calibration circuit includes: a comparator having inputs for coupling to the resistive device; a replica circuit having the calibration device with a programmable parameter; and logic to adjust the programmable parameter according to an output of the comparator. In one embodiment, the comparator is a differential flash comparator.

In another example, a system is provided which comprises, a memory; a reference device; a processor coupled to the memory and the reference device, the processor having a plurality of circuit units, each circuit unit is operable to electronically couple with the reference device such that only one circuit unit of the plurality of circuit units is electronically coupled to the reference device at a given time while other circuit units of the plurality are electronically uncoupled to the reference device during that time; and a wireless interface for allowing the processor to communicatively couple to another device.

In one embodiment, the processor includes logic to provide a valid token to one of the circuit units of the plurality to cause that circuit unit to electronically couple with the resistive device, while the logic is to provide an invalid token to other circuit units to cause the other circuit units to electronically uncouple with the reference device.

In another example, an apparatus is provided which comprises: a reference device; and a processor including: a plurality of circuit units; and logic to provide a valid token to one of the circuit units of the plurality to cause that circuit unit to electronically couple with the resistive device, while the logic is to provide an invalid token to other circuit units to cause the other circuit units to electronically uncouple with the reference device. In one embodiment, the processor includes an internal calibration device which is calibrated, via a calibration circuit of the electrically coupled circuit unit, using the reference device.

In another example, a method is provided which comprises: providing a reference device; and electronically coupling each circuit unit of a plurality of circuit units of a processor, wherein each circuit unit is operable to electronically couple with the reference device such that only one circuit unit of the plurality of circuit units is electronically coupled to the reference device at a given time while other circuit units of the plurality are electronically uncoupled to the reference device during that time.

In one embodiment, the method further comprises positioning the reference device external to the processor. In one embodiment, the method further comprises incorporating the reference device in a package of the processor. In one embodiment, the reference device is at least one of: a resistor, current source, or diode. In one embodiment, the method further comprises: electronically coupling a first metal line of the processor to one of the circuit units of the plurality of circuit units with a first terminal of the reference device, and forming the first metal line from a metal layer with lower resistivity compared to other metal layers in the processor.

In one embodiment, the method further comprises: coupling an additional metal line of the processor to the first terminal of the reference device; and coupling a second terminal of the reference device to a power or ground plane. In one embodiment, the method further comprises forming the additional metal line from a metal layer with higher resistivity compared to resistivity of the first metal line.

In one embodiment, the method further comprises routing the additional metal line in parallel to the first metal line. In one embodiment, the method further comprises electronically coupling the additional metal line to each of the circuit units of the plurality of circuit units. In one embodiment, the processor includes a pair of metal lines, and wherein the method further comprises coupling each metal line of the pair of metal lines to the first terminal and a second terminal of the reference device.

In one embodiment, the method further comprises forming the pair of metal lines from metal layers with higher resistivity compared to resistivity of the first metal line. In one embodiment, the method further comprises routing the pair of metal lines in parallel to the first metal line. In one embodiment, the method further comprises electronically coupling the pair of metal lines to each of the circuit units of the plurality of circuit units. In one embodiment, the method further comprises: electronically coupling a second metal line of the processor to one of the circuit units of the plurality of circuit units with a second terminal of the reference device; and forming the second metal line from the same type of metal layer as the first metal line.

In one embodiment, the method further comprises coupling the second terminal of the reference device to a ground node inside the processor. In one embodiment, the method further comprises coupling the second terminal of the reference device to a bias node inside the processor. In one embodiment, the method further comprises coupling the second terminal of the reference device to a ground node external to the processor. In one embodiment, the method further comprises: providing a valid token to one of the circuit units of the plurality to cause that circuit unit to electronically couple with the resistive device; and providing an invalid token to other circuit units to cause the other circuit units to electronically uncouple with the reference device. In one embodiment, the method further comprises causing each of the circuit units to electronically couple with the reference device in a round robin such that at any one time only one circuit unit of the plurality is electronically coupled to the reference device. In one embodiment, the method further comprises calibrating an internal calibration device using the reference device.

In another example, an apparatus is provided which comprises: means for providing a reference device; and means for electronically coupling each circuit unit of a plurality of circuit units of a processor, wherein each circuit unit is operable to electronically couple with the reference device such that only one circuit unit of the plurality of circuit units is electronically coupled to the reference device at a given time while other circuit units of the plurality are electronically uncoupled to the reference device during that time.

In one embodiment, the apparatus further comprises means for positioning the reference device external to the processor. In one embodiment, the apparatus further comprises means for incorporating the reference device in a package of the processor. In one embodiment, the reference device is at least one of: a resistor, current source, or diode. In one embodiment, the apparatus further comprises: means for electronically coupling a first metal line of the processor to one of the circuit units of the plurality of circuit units with a first terminal of the reference device, and means for forming the first metal line from a metal layer with lower resistivity compared to other metal layers in the processor.

In one embodiment, the apparatus further comprises: means for coupling an additional metal line of the processor to the first terminal of the reference device; and means for coupling a second terminal of the reference device to a power or ground plane. In one embodiment, the apparatus further comprises means for forming the additional metal line from a metal layer with higher resistivity compared to resistivity of the first metal line. In one embodiment, the apparatus further comprises means for routing the additional metal line in parallel to the first metal line.

In one embodiment, the apparatus further comprises means for electronically coupling the additional metal line to each of the circuit units of the plurality of circuit units. In one embodiment, the processor includes a pair of metal lines, and wherein the method further comprises coupling each metal line of the pair of metal lines to the first terminal and a second terminal of the reference device. In one embodiment, the apparatus further comprises means for forming the pair of metal lines from metal layers with higher resistivity compared to resistivity of the first metal line.

In one embodiment, the apparatus further comprises means for routing the pair of metal lines in parallel to the first metal line. In one embodiment, the apparatus further comprises means for electronically coupling the pair of metal lines to each of the circuit units of the plurality of circuit units. In one embodiment, the apparatus further comprises: means for electronically coupling a second metal line of the processor to one of the circuit units of the plurality of circuit units with a second terminal of the reference device; and means for forming the second metal line from the same type of metal layer as the first metal line.

In one embodiment, the apparatus further comprises means for coupling the second terminal of the reference device to a ground node inside the processor. In one embodiment, the apparatus further comprises means for coupling the second terminal of the reference device to a bias node inside the processor. In one embodiment, the apparatus further comprises means for coupling the second terminal of the reference device to a ground node external to the processor.

In one embodiment, the apparatus further comprises: means for providing a valid token to one of the circuit units of the plurality to cause that circuit unit to electronically couple with the resistive device; and means for providing an invalid token to other circuit units to cause the other circuit units to electronically uncouple with the reference device. In one embodiment, the apparatus further comprises means for causing each of the circuit units to electronically couple with the reference device in a round robin such that at any one time only one circuit unit of the plurality is electronically coupled to the reference device. In one embodiment, the apparatus further comprises means for calibrating an internal calibration device using the reference device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. A system comprising:
   a memory;
   a reference device;
   a processor coupled to the memory and the reference device, the processor having a plurality of circuit units and an internal device, each circuit unit is operable to electronically couple with the reference device such that one circuit unit of the plurality of circuit units is electronically coupled to the reference device at a given time while other circuit units of the plurality are electronically uncoupled to the reference device during that time, wherein the internal device is calibrated using the reference device, via a calibration circuit of the one circuit unit electrically coupled to the reference device.

2. The system further comprising:
a wireless interface for allowing the processor to communicatively couple to another device.

3. The system of claim 1, wherein the processor includes logic to provide a valid token to one of the circuit units of the plurality to cause that circuit unit to electronically couple with the reference device.

4. The system of claim 3, wherein the logic to provide an invalid token to other circuit units to cause the other circuit units to electronically uncouple with the reference device.

5. The system of claim 1, wherein the processor includes logic to issue tokens for the circuit units at a programmable rate to allow each circuit unit to update their calibration code in view of time varying effects.

6. The system of claim 1, wherein the processor includes logic to issue tokens after a preset change in temperature is detected.

7. The system of claim 1, wherein the reference device to calibrate any number of calibration devices in the circuit units such that the processor to use a single pin for calibration purposes.

8. The system of claim 1, wherein the processor includes logic to cause each circuit unit to electrically couple to the reference device in a round robin fashion.

9. The system of claim 1, wherein the reference device is at least one of: a resistor, current source, or diode.

10. The system of claim 1, wherein the reference device is positioned external to the processor, or wherein the reference device is incorporated in a package of the processor.

11. An apparatus comprising:
a reference device; and
a processor including:
 a plurality of circuit units, and
 an internal calibration device; and
logic to provide a valid token to one of the circuit units of the plurality to cause that circuit unit to electronically couple with the reference device, while the logic is to provide an invalid token to other circuit units to cause the other circuit units to electronically uncouple with the reference device, and wherein the internal calibration device is calibrated, via a calibration circuit of the electrically coupled circuit unit, using the reference device.

12. An apparatus comprising:
a reference device; and
a processor including;
a plurality of circuit units; and
logic to provide a valid token to one of the circuit units of the plurality to cause that circuit unit to electronically couple with the reference device, while the logic is to provide an invalid token to other circuit units to cause the other circuit units to electronically uncouple with the reference device, wherein the logic to cause one of the circuit units to electronically couple with the reference device for a predetermined time.

13. The apparatus of claim 11, wherein the logic to cause one of the circuit units to electronically couple with the reference device until calibration has completed.

14. The apparatus of claim 11, wherein the one circuit unit compromises a selection circuit, a comparator, and a finite state machine.

15. The apparatus of claim 14, wherein the selection circuit to electrically couple first and second inputs of the comparator to first and second sense lines, respectively, based on the valid token.

16. A processor comprising:
a plurality of circuit units;
logic to provide a valid token to one of the circuit units of the plurality to cause that circuit unit to electronically couple with a reference device, while the logic is to provide an invalid token to other circuit units to cause the other circuit units to electronically uncouple with the reference device; and
an internal calibration device which is calibrated, via a calibration circuit of the electrically coupled circuit unit, using the reference device.

17. A processor comprising:
a plurality of circuit units; and
logic to provide a valid token to one of the circuit units of the plurality to cause that circuit unit to electronically couple with a reference device, while the logic is to provide an invalid token to other circuit units to cause the other circuit units to electronically uncouple with the reference device, wherein the one circuit unit compromises a selection circuit, a comparator, and a finite state machine.

18. The processor of claim 17, wherein the selection circuit to electrically couple first and second inputs of the comparator to first and second sense lines, respectively, based on the valid token.

* * * * *